United States Patent
Hsu et al.

(10) Patent No.: US 10,011,476 B1
(45) Date of Patent: Jul. 3, 2018

(54) MEMS APPARATUS HAVING IMPACT ABSORBER

(71) Applicant: Industrial Technology Research Institute, Hsinchu (TW)

(72) Inventors: Yu-Wen Hsu, Tainan (TW); Chin-Fu Kuo, Tainan (TW); Chao-Ta Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/393,268

(22) Filed: Dec. 29, 2016

(51) Int. Cl.
B81B 3/00 (2006.01)

(52) U.S. Cl.
CPC .................. B81B 3/0072 (2013.01)

(58) Field of Classification Search
CPC .... B81B 3/0072; B81B 3/0051; B81B 3/0059
See application file for complete search history.

(56) References Cited

U.S. PATENT DOCUMENTS

| 516,891 | A | 3/1894 | Hentz |
|---|---|---|---|
| 7,019,231 | B2 | 3/2006 | Ishikawa et al. |
| 7,564,172 | B1 | 7/2009 | Huang |
| 8,124,895 | B2 | 2/2012 | Merassi et al. |
| 8,456,724 | B2 | 6/2013 | Lin |
| 8,516,891 | B2 | 8/2013 | Zhang et al. |
| 8,607,638 | B2 | 12/2013 | Jeung et al. |
| 8,643,927 | B2 | 2/2014 | Takubo et al. |
| 8,661,900 | B2 | 3/2014 | Merassi et al. |
| 8,748,205 | B1 | 6/2014 | Liang et al. |
| 8,960,002 | B2 | 2/2015 | Nasiri et al. |
| 8,973,438 | B2 | 3/2015 | Kim et al. |
| 9,134,337 | B2 | 9/2015 | Simoni et al. |

(Continued)

FOREIGN PATENT DOCUMENTS

| CN | 101578686 | 11/2009 |
|---|---|---|
| CN | 103557853 | 2/2014 |

(Continued)

OTHER PUBLICATIONS

Kaisi Xu, et al., "A Novel Shock Protection Method Based on MEMS Compliant Latching Stopper," 2016 IEEE 29th International Conference on Micro Electro Mechanical Systems (MEMS), Jan. 24-28, 2016, pp. 1125-1128.

(Continued)

*Primary Examiner* — Roy Potter
*Assistant Examiner* — Paul Patton
(74) *Attorney, Agent, or Firm* — JCIPRNET

(57) ABSTRACT

A MEMS apparatus includes a substrate, a cover disposed on the substrate, a movable mass disposed on the substrate, and an impact absorber disposed on the cover. The impact absorber includes a restraint, a stationary stopper disposed on a lower surface of the cover, a movable stopper, elastic elements connecting the restraint and the movable stopper, a supporting element connecting the restraint and the stationary stopper, and a space disposed between the stationary stopper and the movable stopper. The impact absorber is adapted to prevent the movable mass from impacting the cover. In addition, the supporting element may be made of an electrical insulation material to reduce electrostatic interaction between the movable mass and the movable stopper.

19 Claims, 5 Drawing Sheets

(56) References Cited

U.S. PATENT DOCUMENTS

| | | | |
|---|---|---|---|
| 9,206,032 B1 * | 12/2015 | Kang | .................... B81B 7/0058 |
| 2009/0167107 A1 | 7/2009 | Huang | |
| 2013/0043510 A1 | 2/2013 | Shu et al. | |
| 2013/0081464 A1 | 4/2013 | Park et al. | |
| 2013/0167640 A1 | 7/2013 | Lim et al. | |
| 2014/0251013 A1 | 9/2014 | Sakaue et al. | |
| 2014/0298910 A1 | 10/2014 | Simoni et al. | |
| 2015/0211884 A1 | 7/2015 | Kim et al. | |

FOREIGN PATENT DOCUMENTS

| | | |
|---|---|---|
| CN | 204097077 | 1/2015 |
| TW | 201226307 | 7/2012 |
| TW | 201307185 | 2/2013 |
| TW | 201537156 | 10/2015 |
| TW | 201617618 | 5/2016 |

OTHER PUBLICATIONS

Toshifumi Konishi, et al., "A capacitive CMOS-MEMS sensor designed by multi-physics simulation for integrated CMOS-MEMS technology," Japanese Journal of Applied Physics, vol. 53, No. 4S, Mar. 2014, pp. 04EE15-1-34EE15-7.

Jian Zhou, et al., "Design and fabrication of a micromachined gyroscope with high shock resistance," Microsystem Technologies, vol. 20, Jan. 2014, pp. 137-144.

Sang Won Yoon, et al., "Micromachined integrated shock protection for MEMS," Sensors and Actuators A: Physical, vol. 130-131, Aug. 14, 2006, pp. 166-175.

"Office Action of Taiwan Counterpart Application," issued on Jan. 26, 2018, p. 1-p. 10, in which the listed references were cited.

\* cited by examiner

MEMS APPARATUS HAVING IMPACT ABSORBER

TECHNICAL FIELD

The present application relates to a MEMS (Microelectromechanical Systems) apparatus, and more particularly, to a MEMS apparatus having impact absorber.

BACKGROUND

At present, MEMS sensors have been widely applied to various fields in modern life. For example, MEMS tire pressure detectors have been applied to various vehicles, whereas MEMS sound transducer, MEMS gyros or MEMS accelerometers have been applied to various smart phones. There are also many other MEMS sensors applied to smart electronic products required in the Internet of things.

The MEMS sensor usually determines changes in physical quantities (e.g., acceleration, angular velocity, geomagnetism, etc.) through motion of a built-in movable element. When a motion range is overly large, the movable element can suffer damages caused by hitting surrounding structures (e.g., a cover). In the prior art, a stationary stopper has been adopted to stop the movable element from generating excessive movements. However, while withstanding the movable element, the existing stopper can produce enormous impact force and yet provide extremely short stop time so the movable element or the surrounding structures can still be damaged in the stopping process.

In addition, electrostatic interaction can be generated between the existing stopper and the movable element. When the movable element with electric charge is close to the stopper, the stopper will generate an induced charge which interferes with a voltage generated by the movable element during measurement thereby affecting accuracy of the movable element during measurement of physical quantities.

SUMMARY

The present application provides a MEMS apparatus having impact absorber, which is capable of preventing a movable element of the MEMS apparatus in motion from damages caused by hitting surrounding structures so reliability of the MEMS apparatus can be effectively ensured.

The present application also provides a MEMS apparatus having impact absorber, which is capable of effectively preventing operation of movable element from interference due to electrostatic interaction to ensure accuracy during measurement.

A MEMS apparatus of the present application includes a substrate, a cover, a movable mass, and an impact absorber. The cover and the movable mass are disposed on the substrate. The impact absorber is disposed on the cover. The impact absorber includes a restraint, a stationary stopper, a movable stopper, an elastic element, a supporting element, and a space. The stationary stopper is disposed on a lower surface of the cover. The elastic element connects the restraint and the movable stopper. The supporting element connects the restraint and the stationary stopper. The space is disposed between the stationary stopper and the movable stopper.

In an embodiment of the present application, the space is surrounded by the supporting element.

In an embodiment of the present application, the movable stopper is configured to move toward the cover and an upper surface of the movable stopper is adapted to enter the space when the movable mass hits the movable stopper.

In an embodiment of the present application, the movable stopper is adapted to contact the stationary stopper.

In an embodiment of the present application, a movable end of the elastic element connects the movable stopper, and a fixed end of the elastic element connects the restraint. A distance from the movable end to the lower surface of the cover is less than a distance from the fixed end to the lower surface of the cover when the movable stopper moves toward the cover.

In an embodiment of the present application, the movable stopper is electrically insulated from the cover.

In an embodiment of the present application, the supporting element is made of an electrical insulation material.

In an embodiment of the present application, the cover further includes a first semiconductor layer, a second semiconductor layer, and an electrical insulation layer. The electrical insulation layer is disposed between the first semiconductor layer and the second semiconductor layer. The movable stopper is electrically insulated from the first semiconductor layer.

In an embodiment of the present application, the movable stopper is electrically connected to the second semiconductor layer, and the movable stopper is adapted to be applied with a voltage through the second semiconductor layer.

In an embodiment of the present application, the cover further includes a first semiconductor layer, a second semiconductor layer, and an electrical insulation layer. The electrical insulation layer is disposed between the first semiconductor layer and the second semiconductor layer. The supporting element is made of the same material as that of the electrical insulation layer. A thickness of the supporting element is substantially equal to a thickness of the electrical insulation layer.

In an embodiment of the present application, the stationary stopper is made of the same material as that of the first semiconductor layer, the movable stopper is made of the same material as that of the second semiconductor layer, and a distance from an upper surface of the supporting element to an upper surface of the first semiconductor layer is substantially equal to a distance from an upper surface of the electrical insulation layer to an upper surface of the first semiconductor layer.

In an embodiment of the present application, a width of the elastic element is less than a width of the restraint.

A MEMS apparatus of the present application includes a substrate, a cover, a movable mass, and an impact absorber. The cover and the movable mass are disposed on the substrate. The impact absorber is disposed on the cover. The cover includes a first semiconductor layer, a second semiconductor layer, and an electrical insulation layer. The electrical insulation layer is disposed between the first semiconductor layer and the second semiconductor layer. The impact absorber includes a restraint, a stationary stopper, a movable stopper, an elastic element, a supporting element, and a space. The stationary stopper is disposed on a lower surface of the cover. The elastic element connects the restraint and the movable stopper. The supporting element connects the restraint and the stationary stopper. The space is disposed between the stationary stopper and the movable stopper. The supporting element is made of the same material as that of the electrical insulation layer. A thickness of the supporting element is substantially equal to a thickness of the electrical insulation layer.

In an embodiment of the present application, the space is surrounded by the supporting element.

In an embodiment of the present application, the movable stopper is configured to move toward the cover and an upper surface of the movable stopper is adapted to enter the space when the movable mass hits the movable stopper.

In an embodiment of the present application, the movable stopper is adapted to contact the stationary stopper.

In an embodiment of the present application, a movable end of the elastic element connects the movable stopper, and a fixed end of the elastic element connects the restraint. A distance from the movable end to the lower surface of the cover is less than a distance from the fixed end to the lower surface of the cover when the movable stopper moves toward the cover.

In an embodiment of the present application, the stationary stopper is made of the same material as that of the first semiconductor layer, the movable stopper is made of the same material as that of the second semiconductor layer, and a distance from an upper surface of the supporting element to an upper surface of the first semiconductor layer is substantially equal to a distance from an upper surface of the electrical insulation layer to an upper surface of the first semiconductor layer.

In an embodiment of the present application, a width of the elastic element is less than a width of the restraint.

To make the above features and advantages of the present application more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
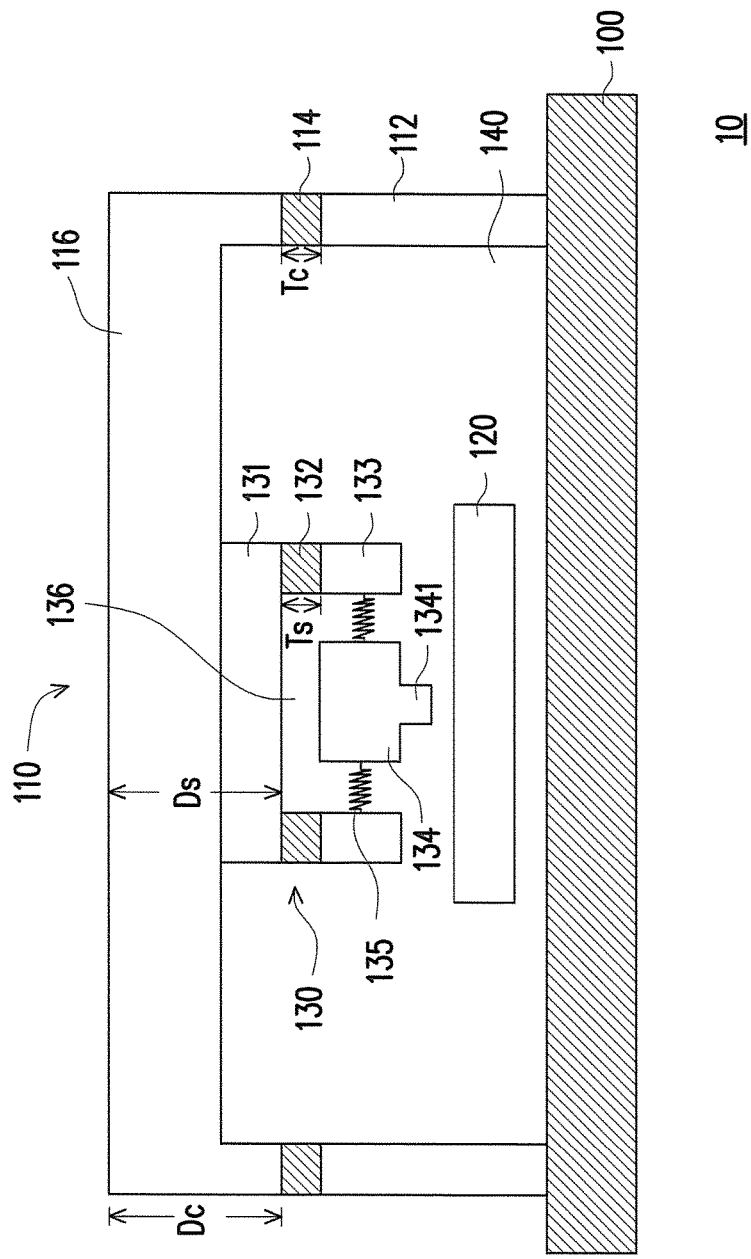
FIG. 1A is a schematic diagram of a MEMS apparatus in an embodiment of the present application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a schematic diagram of a MEMS apparatus in an embodiment of the present application. As shown in FIG. 1A, a MEMS apparatus 10 of the present embodiment includes a substrate 100, a cover 110, a movable mass 120, and an impact absorber 130. The cover 110 is disposed on a surface of the substrate 100. The cover 110 and the substrate 100 constitute an accommodating space 140. The movable mass 120 is disposed in the accommodating space 140 between the substrate 100 and the cover 110. In the present embodiment, the movable mass 120 is, for example, a sensing mass disposed in the MEMS apparatus for detecting physical quantities (acceleration, angular velocity, geomagnetism, etc.) through displacements of the sensing mass.

Further, the impact absorber 130 is disposed in the accommodating space 140 on an inner side of the cover 110 and configured to prevent the movable mass 120 in motion from impacting the cover 110. The impact absorber 130 of the present embodiment includes a stationary stopper 131, a supporting element 132, a restraint 133, a movable stopper 134 and a plurality of elastic elements 135. The stationary stopper 131 is disposed on a lower surface of the cover 110. The supporting element 132 is disposed on an outer edge of a lower surface of the stationary stopper 131. The restraint 133 is disposed on a lower surface of the supporting element 132 and surrounds the movable stopper 134. The elastic element 135 connects the movable stopper 134 and the restraint 133 so the movable stopper 134 can move toward the stationary stopper 131. A space 136 is defined between the stationary stopper 131 and the movable stopper 134 when the movable stopper 134 is not hit by the movable mass 120. And space 136 serves as a buffer space when the movable stopper 134 moves toward the stationary stopper 131.

Figure 1B:
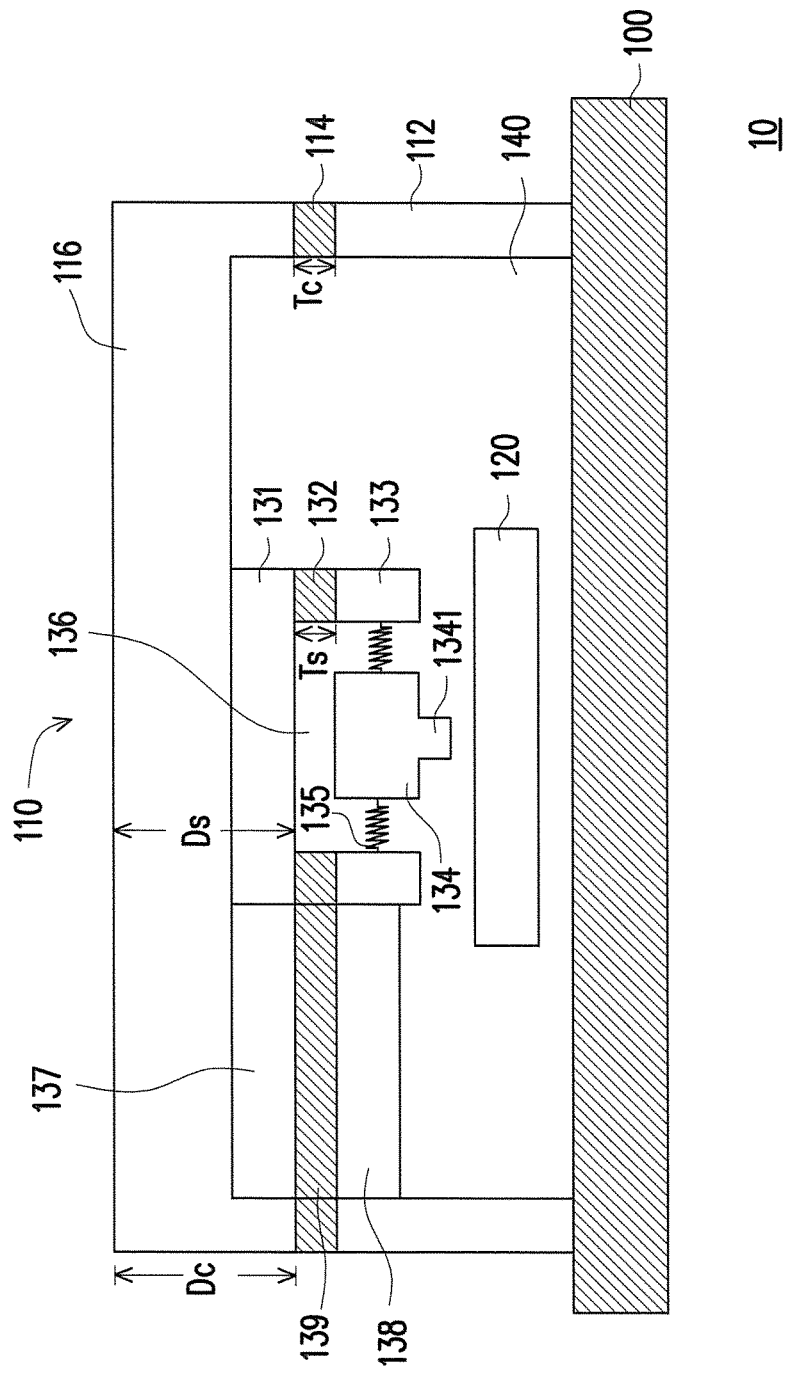
FIG. 1B is a schematic diagram of a MEMS apparatus in another embodiment of the present application.
Figure 2A:
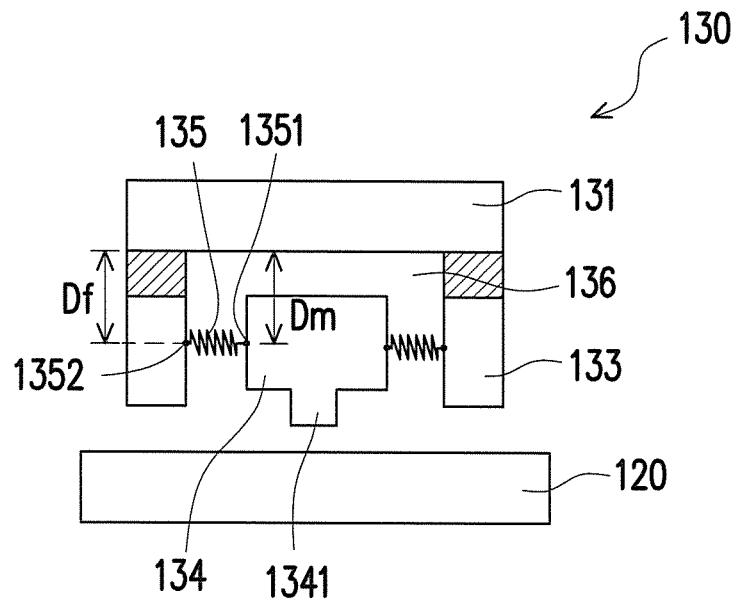
FIG. 2A and FIG. 2B are schematic diagrams of actions of the impact absorber and the movable mass in FIG. 1A and FIG. 1B before and after impact, respectively.
Figure 2B:
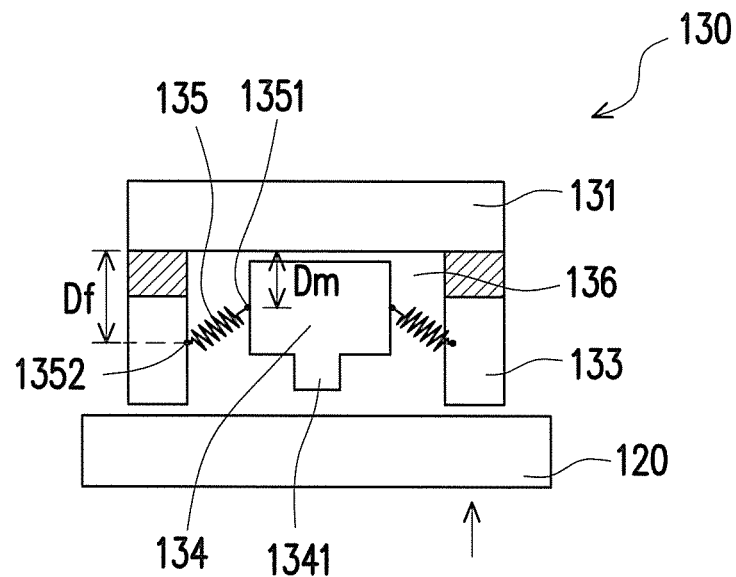

FIG. 2A and FIG. 2B are schematic diagrams of actions of the impact absorber 130 and the movable mass 120 in FIG. 1 before and after impact. As shown in FIGS. 1, 2A and 2B, when an external force (e.g., an acceleration force perpendicular to the surface of the substrate) is applied on the MEMS apparatus 10, the movable mass 120 can move toward the impact absorber 130 from the position near the substrate 100 (FIG. 2A). When the movable mass 120 hits the movable stopper 134, a stopper 1341 of the movable stopper 134 is in contact with the movable mass 120 so the movable stopper 134 then moves toward the cover 110 and enters the space 136 (FIG. 2B). At this point, each of the elastic elements 135 is pulled by the movable stopper 134 to generate elastic deformation for storing an elastic potential energy. Conversely, once the external force is removed, the movable mass 120 is no longer in contact with the stopper 1341 of the movable stopper 134. The elastic potential energy stored by the elastic element 135 is therefore released to bring the movable stopper 134 back to the position shown in FIG. 2A.

Figure 4:
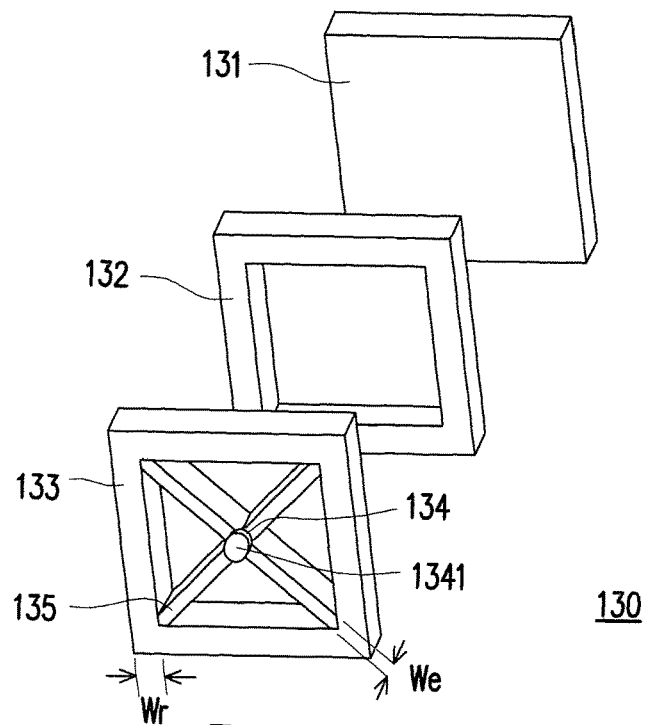
FIG. 4 is an exploded view of an impact absorber in an embodiment of the present application.

The followings refer to FIG. 2A and FIG. 4 together. Specifically, each of the elastic elements 135 in the present embodiment has a movable end 1351 connecting the movable stopper 134 and a fixed end 1352 connecting the restraint 133. A width (We) of the elastic element 135 is less than a width (Wr) of the restraint 133. The elastic elements 135 of the present embodiment are, for example, beams integrally formed with the movable stopper 134. For example, there are four beams connected to four corners of the restraint 133 respectively. The number and shape of the elastic elements 135 are not particularly limited in the present application. The number and shape of the elastic elements 135 may be adjusted according to design or other requirements.

In the present embodiment, the space 136 is surrounded by the supporting element 132, and configured to provide the space when the elastic element 135 deforms and when the movable stopper 134 moves, so a stop time (a time during which a speed of the movable mass 120 becomes zero) of the movable stopper 120 can be extended. In addition, kinetic energy of the movable mass 120 can be absorbed by the deformation of the elastic element 135. Herein, dimensions of the space 136 may be determined by taking into consideration of various factors, such as dimensions of each portion of the impact absorber 130 and magnitude of kinetic energy generated by the movable mass 120.

As shown in FIG. 2A and FIG. 2B, when the movable mass 120 hits the movable stopper 134, each of the elastic elements 135 extends such that the movable end 1351 moves with the movable stopper 134 and moves away from the respective fixed end 1352. At this point, an upper surface of the movable stopper 134 enters the space 136. When the movable stopper 134 reaches the stationary stopper 131 and stops moving, the movable stopper 134 have a maximum displacement. When the movable stopper 134 moves toward the stationary stopper 131, a distance (Dm) from each movable end 1351 to the lower surface of the stationary stopper 131 is less than a distance (Df) from the fixed end 1352 to the lower surface of the stationary stopper 11.

Figure 3:
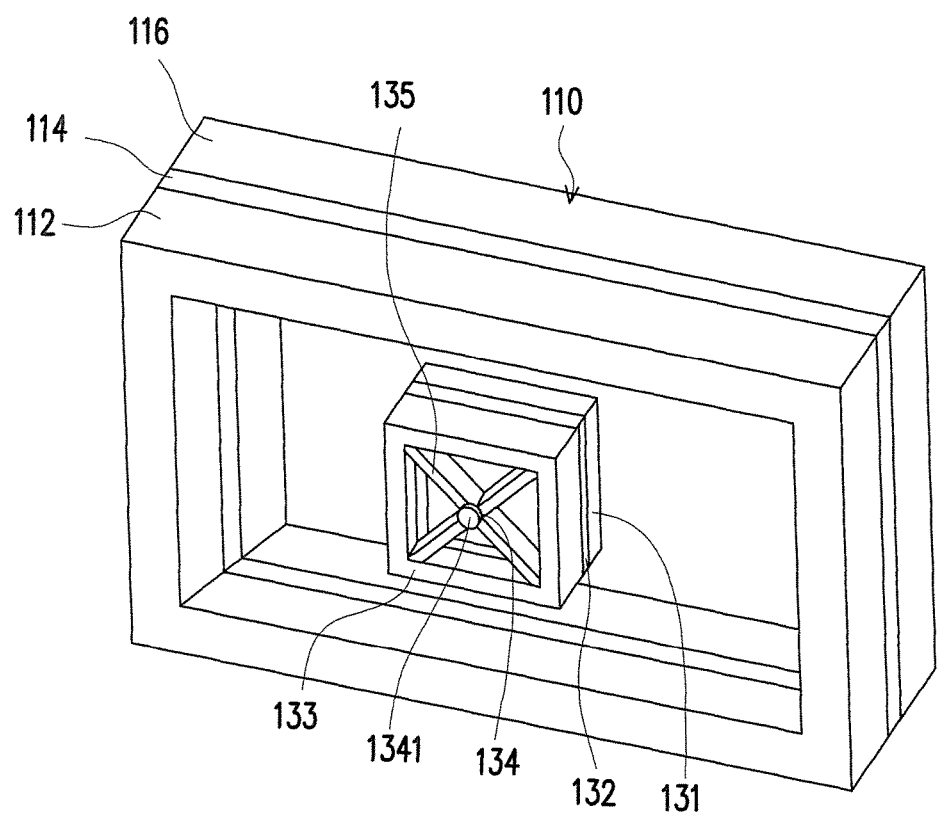
FIG. 3 illustrates a local structure of a MEMS apparatus in an embodiment of the present application.

A specific structure of the impact absorber 130 of the present embodiment will be described below with provided examples. FIG. 3 illustrates a local structure of a MEMS apparatus in an embodiment of the present application. FIG. 4 is an exploded view of an impact absorber in an embodiment of the present application. Referring to FIGS. 1, 3 and 4 together, the cover 110 and the impact absorber 130 may be manufactured by a SOI (Silicon On Insulator) substrate at the same time. Specifically, the SOI substrate includes a handle layer, a device layer, and an insulation layer disposed between the handle layer and the device layer. The handle layer and the device layer are made of silicon, and the insulation layer is an electrical insulation layer such as silicon dioxide ($SiO_2$). In the present embodiment, the device layer is used to manufacture the restraint 133, the movable stopper 134, the elastic elements 135 in the impact absorber 130 and a second semiconductor layer 112 of the cover 110. The insulation layer is used to manufacture the supporting element 132 in the impact absorber 130 and an electrical insulation layer 114 of the cover 110. The handle layer is used to manufacture the stationary stopper 131 in the impact absorber 130 and a first semiconductor layer 116 of the cover 110.

As described above, the cover 110 formed in the present embodiment includes the first semiconductor layer 116, the electrical insulation layer 114, and the second semiconductor layer 112. The first semiconductor layer 116 serves as a top portion of the cover 110 and covers the accommodating space 140. Because the electrical insulation layer 114 is disposed between the first semiconductor layer 116 and the second semiconductor layer 112 and the supporting element 132 connecting the movable stopper 134 is also made of an electrical insulation material, the movable stopper 134 is electrically insulated from the cover 110. More specifically, due to separation by the electrical insulation layer 114 and the supporting element 132, the movable stopper 134 is electrically insulated from the first semiconductor layer 116 and the second semiconductor layer 112 of the cover 110. Accordingly, the movable stopper 134 can be prevented from generating the induced charge due to the external electromagnetic interference to thereby reduce electrostatic interaction between the movable stopper 134 and the movable mass 120. Therefore, accuracy of the MEMS apparatus 10 during measurement can be improved by making the movable stopper 134 electrically insulated from the cover 110.

On the other hand, the supporting element 132 of the present embodiment is, for example, a frame structure configured to surround the space 136. Because the electrical insulation layer 114 in the cover 110 and the supporting element 132 in the impact absorber 130 are manufactured using the same insulation layer in the SOI substrate, the supporting element 132 and the electrical insulation layer 114 are made of the same material. In other words, in the present embodiment, the supporting element 132 is made of the electrical insulation material. In addition, with a structural design in which a thickness Ts of the supporting element 132 is substantially equal to a thickness Tc of the electrical insulation layer 114, the supporting element 132 and the electrical insulation layer 114 can be manufactured at the same time using the same wet etching process, such as a HF wet etching process. In this way, the effect of reducing processing time and lowering processing costs can then be achieved. Since the supporting element 132 is the electrical insulation material, the stationary stopper 131 and the restraint 133 are electrically insulated from each other. In addition, in order to simultaneously manufacture the supporting element 132 and the space 136 by etching the insulation layer of the SOI substrate using the same wet etching process, a width (We) of the elastic element 135 can be made to be less than a width (Wr) of the restraint 133, as shown in FIG. 4.

In the present embodiment, the first semiconductor layer 116 and the stationary stopper 131 are manufactured using a dry etching (e.g., Deep Reaction Ion Etching; Deep RIE) process adopted by the same handle layer of the same SOI substrate. Therefore, the stationary stopper 131 is made of the same silicon material as that of the first semiconductor layer 116. With a restraining condition in which a distance (Ds) from an upper surface of the supporting element 132 to an upper surface of the first semiconductor layer 116 is substantially equal to a distance (Dc) from an upper surface of the electrical insulation layer 114 to an upper surface of the first semiconductor layer 116, the stationary stopper 131 and the first semiconductor layer 116 can be manufactured at the same time using the same dry etching process. In this way, the effect of reducing processing time and lowering processing costs can then be achieved.

FIG. 1B is a schematic diagram of a MEMS apparatus in an embodiment of the present application. As shown in FIG. 1B, a structure of the present embodiment is approximately identical to that of the embodiment in FIG. 1A. The difference is that, the impact absorber 130 in FIG. 1B has a first electrical path 137, a second electrical path 138 and an intermediate layer 139. Among them, the first electrical path 137 is disposed between the stationary stopper 131 and the first semiconductor layer 116. The first electrical path 137 is, as similar to the first semiconductor layer 116 and the stationary stopper 131, manufactured by the same handle layer of the SOI substrate. Thus, the first electrical path 137 is, for example, made of the silicon material.

In the present embodiment, the second electrical path 138 is disposed between the restraint 133 and the second semiconductor layer 112. The second electrical path 138 is, as similar to the second semiconductor layer 112 and the movable stopper 134, manufactured by the same device layer of the SOI substrate. Thus, the second electrical path 138 is, for example, made of the silicon material.

In the present embodiment, the intermediate layer 139 connects each of the supporting element 132 and the electrical insulation layer 114. The intermediate layer 139 is disposed between the first electrical path 137 and the second electrical path 138. Because the intermediate layer 139 is, as similar to the supporting element 132 and the electrical insulation layer 114, manufactured by the same insulation layer of the SOI substrate, the intermediate layer 139 is, for example, made of the electrical insulation material. Hence, the first electrical path 137 is electrically insulated from the second electrical path 138.

Referring to FIG. 1B, more specifically, the movable stopper 134 is electrically connected to the second semiconductor layer 112 through the elastic elements 135, the restraint 133 and the second electrical path 138. The movable stopper 134 can be applied with a voltage (identical to a voltage of the movable mass 120) through the second semiconductor layer 112, the second electrical path 138, the restraint 133 and the elastic element 135. In this way, because there is no voltage difference between the movable stopper 134 and the movable mass 120, the induced charge may be prevented from being generated to thereby reduce electrostatic interaction between the movable stopper 134 and the movable mass 120.

In addition, as shown in FIGS. 1 to 4, in the foregoing embodiments, to further ensure that the movable stopper 134 can impact properly with the movable mass 120, the stopper 1341 of the movable stopper 134 can be made protruding outside the restraint 133 and facing the movable mass 120. In this way, when moving toward the movable stopper 134, the movable mass 120 will hit the stopper 1341 first instead of the restraint 133. Accordingly, the restraint 133 can be prevented from damages caused by overly large impact force.

Figure 5:
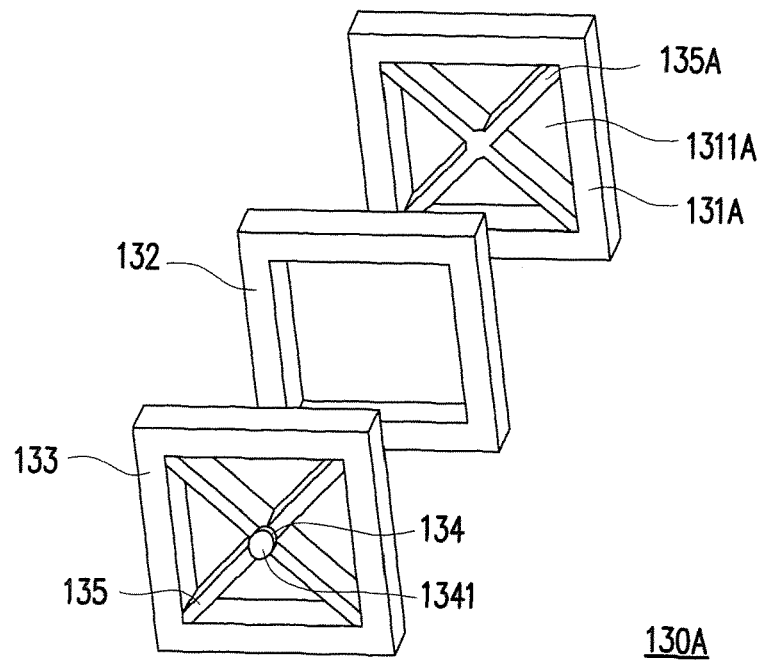
FIG. 5 is an exploded view of an impact absorber in another embodiment of the present application.

FIG. 5 is an exploded view of an impact absorber in another embodiment of the present application. As shown in FIG. 5, an impact absorber 130A of the present embodiment has a structure approximately identical to that of the impact absorber 130 in FIG. 4. The difference is that, the stationary stopper 131 of the impact absorber 130 in FIG. 4A is a solid structure, whereas a stationary stopper 131A of the present embodiment has a groove 1311A and a plurality of elastic elements 135A. The groove 1311A penetrates the stationary stopper 131A so multiple pillars are formed to serve as the elastic elements 135A. In the present embodiment, a weight of the stationary stopper 131A can be reduced while maintaining the same structural strength of the stationary stopper 131 with the groove 1311A. When the movable stopper 134 hits the stationary stopper 131A due to overly large impact force, the elastic elements 135A can provide the similar impact bearing capability of the stationary stopper 131 of the solid structure.

In summary, the present application provides a MEMS apparatus having impact absorber, in which the impact absorber is disposed between the cover and the movable mass. As a result, the impact absorber can absorb impact energy of the movable mass to prevent the movable mass from damages and failures caused by hitting the cover or other internal structures. In addition, the impact absorber can reduce electrostatic interaction between the movable mass and the movable stopper by the supporting element made of the electrical insulation material to thereby improve accuracy during measurement.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. A MEMS apparatus, comprising:
    a substrate;
    a cover disposed on the substrate;
    a movable mass disposed on the substrate; and
    an impact absorber disposed on the cover, the impact absorber comprising:
        a restraint;
        a stationary stopper disposed on a lower surface of the cover;
        a movable stopper;
        an elastic element connecting the restraint and the movable stopper;
        a supporting element connected between the restraint and the stationary stopper; and
        a space disposed between the stationary stopper and the movable stopper.

2. The MEMS apparatus of claim 1, wherein the space is surrounded by the supporting element.

3. The MEMS apparatus of claim 1, wherein the movable stopper is configured to move toward the cover and an upper surface of the movable stopper is adapted to enter the space when the movable mass hits the movable stopper.

4. The MEMS apparatus of claim 1, wherein the movable stopper is adapted to contact the stationary stopper.

5. The MEMS apparatus of claim 1, wherein a movable end of the elastic element connects the movable stopper, a fixed end of the elastic element connects the restraint, and a distance from the movable end to the lower surface of the cover is less than a distance from the fixed end to the lower surface of the cover when the movable stopper moves toward the cover.

6. The MEMS apparatus of claim 1, wherein the movable stopper is electrically insulated from the cover.

7. The MEMS apparatus of claim 6, wherein the supporting element is made of an electrical insulation material.

8. The MEMS apparatus of claim 6, wherein the cover further comprises a first semiconductor layer, a second semiconductor layer, and an electrical insulation layer disposed between the first semiconductor layer and the second semiconductor layer, the movable stopper is electrically insulated from the first semiconductor layer.

9. The MEMS apparatus of claim 8, wherein the movable stopper is electrically connected to the second semiconductor layer, and the movable stopper is adapted to be applied with a voltage through the second semiconductor layer.

10. The MEMS apparatus of claim 6, wherein the cover further comprises a first semiconductor layer, a second semiconductor layer, and an electrical insulation layer disposed between the first semiconductor layer and the second semiconductor layer, and the supporting element is made of the same material as that of the electrical insulation layer, and a thickness of the supporting element is substantially equal to a thickness of the electrical insulation layer.

11. The MEMS apparatus of claim 10, wherein the stationary stopper is made of the same material as that of the first semiconductor layer, the movable stopper is made of the same material as that of the second semiconductor layer, and a distance from an upper surface of the supporting element to an upper surface of the first semiconductor layer is substantially equal to a distance from an upper surface of the electrical insulation layer to an upper surface of the first semiconductor layer.

12. The MEMS apparatus of claim 10, wherein a width of the elastic element is less than a width of the restraint.

13. A MEMS apparatus, comprising:
    a substrate;
    a cover disposed on the substrate, comprising
        a first semiconductor layer;
        a second semiconductor layer; and an electrical insulation layer, wherein the electrical insulation layer is disposed between the first semiconductor layer and the second semiconductor layer;
a movable mass disposed on the substrate;
an impact absorber disposed on the cover, the impact absorber comprising:
  a restraint;
  a stationary stopper disposed on a lower surface of the cover;
  a movable stopper;
  an elastic element connecting the restraint and the movable stopper;
  a supporting element connecting the restraint and the stationary stopper; and
  a space disposed between the stationary stopper and the movable stopper;
wherein the supporting element is made of the same material as that of the electrical insulation layer, and a thickness of the supporting element is substantially equal to a thickness of the electrical insulation layer.

14. The MEMS apparatus of claim 13, wherein the space is surrounded by the supporting element.

15. The MEMS apparatus of claim 13, wherein the movable stopper is configured to move toward the cover and an upper surface of the movable stopper is adapted to enter the space when the movable mass hits the movable stopper.

16. The MEMS apparatus of claim 13, wherein the movable stopper is adapted to contact the stationary stopper.

17. The MEMS apparatus of claim 13, wherein a movable end of the elastic element connects the movable stopper, a fixed end of the elastic element connects the restraint, and a distance from the movable end to the lower surface of the cover is less than a distance from the fixed end to the lower surface of the cover when the movable stopper moves toward the cover.

18. The MEMS apparatus of claim 13, wherein the stationary stopper is made of the same material as that of the first semiconductor layer, the movable stopper is made of the same material as that of the second semiconductor layer, and a distance from an upper surface of the supporting element to an upper surface of the first semiconductor layer is substantially equal to a distance from an upper surface of the electrical insulation layer to an upper surface of the first semiconductor layer.

19. The MEMS apparatus of claim 13, wherein a width of the elastic element is less than a width of the restraint.

* * * * *